United States Patent
Schindler et al.

(10) Patent No.: US 6,627,934 B1
(45) Date of Patent: Sep. 30, 2003

(54) INTEGRATED SEMICONDUCTOR MEMORY CONFIGURATION WITH A BURIED PLATE ELECTRODE AND METHOD FOR ITS FABRICATION

(75) Inventors: Günther Schindler, München (DE); Carlos Mazure-Espejo, Zorneding (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,696

(22) Filed: Mar. 30, 1999

Related U.S. Application Data

(63) Continuation of application No. PCT/DE97/02219, filed on Sep. 26, 1997.

(30) Foreign Application Priority Data

Sep. 30, 1996 (DE) ........................................ 196 40 215

(51) Int. Cl.[7] ............................................. H01L 27/108
(52) U.S. Cl. ...................... 257/296; 257/301; 257/303; 257/308; 257/621
(58) Field of Search ................................ 257/296, 295, 257/301, 303, 304, 306, 307, 308, 310, 311, 276, 621, 698; 438/3, 238, 239, 244, 253, 243, 386, 387, 396, 399

(56) References Cited

U.S. PATENT DOCUMENTS

| | | | |
|---|---|---|---|
| 4,794,434 A | 12/1988 | Pelley, III | 257/301 |
| 4,959,709 A * | 9/1990 | Watanabe | 257/304 |
| 5,026,658 A * | 6/1991 | Fuse et al. | 438/248 |
| 5,225,698 A * | 7/1993 | Kim et al. | 257/303 |
| 5,309,008 A | 5/1994 | Watanabe | 257/304 |
| 5,411,911 A | 5/1995 | Ikeda et al. | 438/246 |
| 5,959,322 A * | 9/1999 | Lee | 257/298 |

FOREIGN PATENT DOCUMENTS

| | | | |
|---|---|---|---|
| DE | 3840559 A1 | 6/1989 | |
| DE | 3920646 A1 | 3/1990 | |
| DE | 3931381 A1 | 3/1991 | |
| EP | 0236089 A2 | 9/1987 | |
| EP | 0 236 089 | 9/1987 | |
| JP | 401119057 A * | 5/1989 | H01L/27/10 |
| JP | 5 013 676 | 1/1993 | |
| JP | 7 086 426 | 3/1995 | |
| JP | 7 086 427 | 3/1995 | |

OTHER PUBLICATIONS

Japanese Patent Abstract No. 01119057 (Fumihiro), dated May 11, 1989.
Japanese Patent Abstract No. 07193141 (Hiroaki), dated Jul. 28, 1995.
Japanese Patent Abstract No. 02072663 (Shigeo), dated Mar. 12, 1990.
Japanese Patent Abstract No. 05299580 (Takuya), dated Nov. 12, 1993.

* cited by examiner

*Primary Examiner*—Shouxiang Hu
(74) *Attorney, Agent, or Firm*—Laurence A. Greenberg; Werner H. Stemer; Ralph E. Locher

(57) ABSTRACT

A semiconductor memory configuration has a plurality of selection transistors. Each selection transistor is connected to a first electrode of a storage capacitor. A second electrode of the storage capacitor is connected to a common plate. The common plate is provided below the selection transistors in a semiconductor body. A method of fabricating a semiconductor memory configuration is also provided.

7 Claims, 2 Drawing Sheets

INTEGRATED SEMICONDUCTOR MEMORY CONFIGURATION WITH A BURIED PLATE ELECTRODE AND METHOD FOR ITS FABRICATION

CROSS-REFERENCE TO RELATED APPLICATION

This is a continuation of copending International Application PCT/DE97/02219, filed Sep. 26, 1997, which designated the United States.

BACKGROUND OF THE INVENTION

Field of the Invention:

The invention relates to an integrated semiconductor memory configuration having a plurality of identical memory cells.

Each of the memory cells has a selection transistor having a drain region, a source region, and a gate. A storage capacitor of the memory cell has a first electrode, a second electrode and also a storage dielectric provided between the two electrodes.

The invention further relates to a method of fabricating an integrated semiconductor memory configuration having a plurality of identical memory cells.

In the case of a memory configuration of this type, additional space for interconnection or wiring is available on a main surface of the insulation layer above the selection transistors.

A memory configuration of this general type is disclosed in the German Published Patent Application DE 38 40 559 A1. The memory configuration described therein has a storage capacitor which is provided below a source region. The storage capacitor is conductively connected to the source region by a first electrode. A second electrode of the storage capacitor is connected to a common plate provided below the source region.

The German Published Patent Application DE 39 31 381 A1 describes a memory configuration having switching elements provided in a substrate below selection transistors. These switching elements may be embodied e.g. as storage capacitors connected by a first electrode to a source region of a selection transistor and by a second electrode to a common plate embodied as a buried interconnection plane.

The U.S. Pat. No. 4,794,434 discloses a memory configuration having a number of selection transistors whose respective source region is connected to a first electrode of a storage capacitor. The storage capacitor is situated in a substrate below the source region, and the second electrode below the source region is formed by a conductive substrate region which is electrically insulated from the source region.

The U.S. Pat. No. 5,309,008 describes a memory configuration having a number of selection transistors each having a source region which is connected to a first electrode of a storage capacitor. The storage capacitors are situated in a substrate in which also the source regions are provided. A second electrode of the storage capacitors is connected to a common plate provided below the source regions.

A disadvantage of the conventional memory configurations is the spatial configuration of the storage capacitors, which have to be fabricated prior to the selection transistors in the course of the production process. Particularly when special storage dielectrics, such as ferroelectric storage dielectrics, are used, contamination of the semiconductor process employed for fabricating the selection transistors can occur as a result of using these storage dielectrics.

SUMMARY OF THE INVENTION

It is accordingly an object of the invention to provide a semiconductor memory configuration, which overcomes the abovementioned disadvantages of the heretofore-known semiconductor memory configurations of this general type and in which additional space is available for interconnections on a main surface of the memory configuration, and which furthermore can easily be fabricated using conventional method steps.

A further object of the invention is to provide a method for fabricating the semiconductor memory configuration according to the invention.

With the foregoing and other objects in view there is provided, in accordance with the invention, an integrated semiconductor memory configuration, comprising:

a) a semiconductor body having a first side and a second side;

b) an insulation layer formed on the first side of the semiconductor body, the insulation layer having a cutout formed therein, the cutout having a side surface;

c) a common plate formed on the second side of the semiconductor body; and d) a memory cell including
   a selection transistor having a drain region formed in the semiconductor body, a source region formed in the semiconductor body and disposed between the cutout in the insulation layer and the common plate, and a gate formed in the insulation layer;
   a storage capacitor provided on the side surface of the cutout, the storage capacitor having a first electrode connected to the source region of the selection transistor, a second electrode connected to the common plate, and a storage dielectric disposed between the first electrode and the second electrode.

In accordance with another feature of the invention, the storage dielectric has ferroelectric properties.

In accordance with yet another feature of the invention, the storage dielectric has a dielectric constant of greater than 10.

In accordance with a further feature of the invention, the storage dielectric is an oxidic dielectric and in particular SBTN $SrBi_2(Ta_{1-x}Nb_x)_2O_9$, SBT $SrBi_2Ta_2O_9$, PZT (Pb, Zr)$TiO_3$, BST (Ba, Sr)$TiO_3$, or ST $SrTiO_3$.

In accordance with another feature of the invention, the cutout is formed centrally over the source region.

In accordance with yet another feature of the invention, a conductive connection element extends downward through the source region and the semiconductor body and connects the second electrode to the common plate.

In accordance with a further feature of the invention, the storage dielectric extends downward through the source region and the semiconductor body to the common plate and surrounds the conductive connection element.

In accordance with another feature of the invention, the storage dielectric and the second electrode extend downward through the source region and the semiconductor body to the common plate and enclose the conductive connection element.

In accordance with yet another feature of the invention, an insulation collar extends downward through the source region and the semiconductor body to the common plate and encloses the conductive connection element in a region of the source region and in a region of the semiconductor body.

In accordance with another feature of the invention, the common plate and the semiconductor body form an integral semiconductor substrate, the common plate being a doped region of the semiconductor substrate.

With the objects of the invention in view, there is also provided a method of fabricating a semiconductor memory configuration, the method which comprises:

providing a semiconductor body having a first side and a second side;

providing an insulation layer on the first side of the semiconductor body;

fabricating a common plate on the second side of the semiconductor body;

doping the semiconductor body for forming a source region and a drain region of a selection transistors;

providing a gate for the selection transistor in the insulation layer;

etching the insulation layer for forming a first cutout in the insulation layer over the source region;

applying a first electrode on a side surface of the first cutout;

further etching the first cutout through the source region and the semiconductor body as far as to the common plate for forming a second cutout;

depositing a storage dielectric and a second electrode on the first electrode and on a side surface of the second cutout; and filling an interspace within the second electrode with conductive material for fabricating a conductive connection element.

With the objects of the invention in view there is furthermore provided a method of fabricating a semiconductor memory configuration, the method which comprises:

providing a semiconductor body having a first side and a second side;

providing an insulation layer on the first side of the semiconductor body;

fabricating a common plate on the second side of the semiconductor body;

doping the semiconductor body for forming a source region and a drain region of a selection transistor;

providing a gate for the selection transistor in the insulation layer;

etching the insulation layer for forming a first cutout in the insulation layer over the source region;

applying a first electrode on a side surface of the first cutout;

depositing a storage dielectric and a second electrode on the first electrode;

further etching the first cutout through the source region and the semiconductor body as far as to the common plate for forming a second cutout;

depositing an insulation layer over the second electrode and on a side surface of the second cutout;

removing the insulation layer from a region of the second electrode for fabricating an insulation collar; and filling an interspace within the second electrode and the insulation collar with conductive material for fabricating a conductive connection element.

In accordance with another mode of the invention, the step of fabricating the common plate includes introducing a dopant into the semiconductor body by deep implantation.

In accordance with yet another mode of the invention, a barrier layer is applied over the source region prior to the step of applying the first electrode or prior to the step of depositing the storage dielectric.

In accordance with a further mode of the invention, the barrier layer is formed of TiN, WN, WTiN, or TaN.

The object of the invention is in particular achieved by providing the storage capacitor on a side surface of a cutout in the insulation layer over the source region.

In the case of the semiconductor memory configuration described, it is possible to use in a simple manner prefabricated configurations, which include selection transistors, for fabricating the memory configuration. The storage capacitors can be fabricated at a location that is different from the location where the selection transistors are fabricated. The risk of contaminating the semiconductor process employed for fabricating the selection transistors is thus avoided.

One embodiment of the invention provides for the use of ferroelectric materials as the storage dielectric. Such ferroelectric materials afford the advantage that the information which is stored in the form of an electric charge in the storage capacitors is preserved after failure of a supply voltage. A further advantage is that the information does not have to be refreshed at regular intervals. Such a refreshing is generally necessary because of leakage currents that occur in the case of customary semiconductor memory configurations, which use a dielectric having paraelectric properties.

The ferroelectric properties of most of the ferroelectric materials which are known to date and are appropriate for storage dielectrics of this type are temperature-dependent. These ferroelectric materials have a ferroelectric behavior below a temperature which is characteristic for them, while they have a paraelectric behavior above this characteristic temperature, the dielectric constant in the paraelectric state being significantly higher than the dielectric constants of storage dielectrics used to date. The temperature below which ferroelectric properties are established is very low in the case of some ferroelectric materials, with the result that, from a technical standpoint, these ferroelectric materials can be used only in the paraelectric state, their dielectric constant in the paraelectric state in each case being above 10, preferably above 100.

One embodiment of the invention provides for the storage dielectric to have a dielectric constant of greater than 10. Materials for storage dielectrics of this type are, for example, the above-mentioned ferroelectric materials which are used at a temperature above their respective characteristic temperature.

One embodiment of the invention provides for the storage dielectric to be an oxidic dielectric. The class of oxidic dielectrics includes, by way of example, SBTN $SrBi_2(Ta_{1-x}Nbx)_2O_9$, SBT $SrBi_2Ta_2O_9$, PZT $(Pb, Zr)TiO_3$, BST $(Ba, Sr)TiO_3$ or ST $SrTiO_3$. The formula $(Pb, Zr)TiO_3$ stands for $Pb_xZr_{1-x}TiO_3$. The proportion of Pb and Zr in this substrate can vary, the ratio of Pb and Zr critically determining the temperature behavior of this dielectric, that is to say determining the temperature below which the substrate has ferroelectric properties or above which the substrate has paraelectric properties. The formula $(Ba, Sr)TiO_3$ stands for $Ba_xSr_{1-x}TiO_3$, wherein the temperature behavior of this substrate can be substantially determined by way of the ratio of Ba to Sr. The list of substances mentioned is in no way complete. The selection of one of the substances as the storage dielectric mainly depends on processing factors during the fabrication method, but also on factors during the use of the semiconductor memory configuration, for example the ambient temperature.

If such materials having a high dielectric constant are used, it is possible to fabricate storage capacitors with sufficient capacitances in conjunction with a small capacitor area.

The cutout in the insulation layer is preferably provided centrally over the source region, as is proposed in a further embodiment of the invention.

A further embodiment of the invention provides for the second electrodes of the respective memory cells to be connected to the common plate by a conductive connection, which extends downward through the source region and the semiconductor body.

In order to insulate the conductive connection from the source region and the semiconductor body, one embodiment of the invention provides for the storage dielectric to extend downward through the source region and the semiconductor body as far as the common plate and to surround the conductive connection. The second electrode can also extend downward through the source region and the semiconductor body as far as the common plate, wherein the second electrode extends downward between the conductive connection and the storage dielectric.

A further embodiment of the invention provides for the conductive connection to be insulated from the source region and the semiconductor body by an insulation collar, which may for example be formed of a semiconductor oxide.

The common plate provided below the selection transistors may be a region of the semiconductor body, wherein the region is doped so that it has a sufficient electrical conductivity.

Other features which are considered as characteristic for the invention are set forth in the appended claims.

Although the invention is illustrated and described herein as embodied in an integrated semiconductor memory configuration with a buried plate electrode and a method of fabrication such an integrated semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
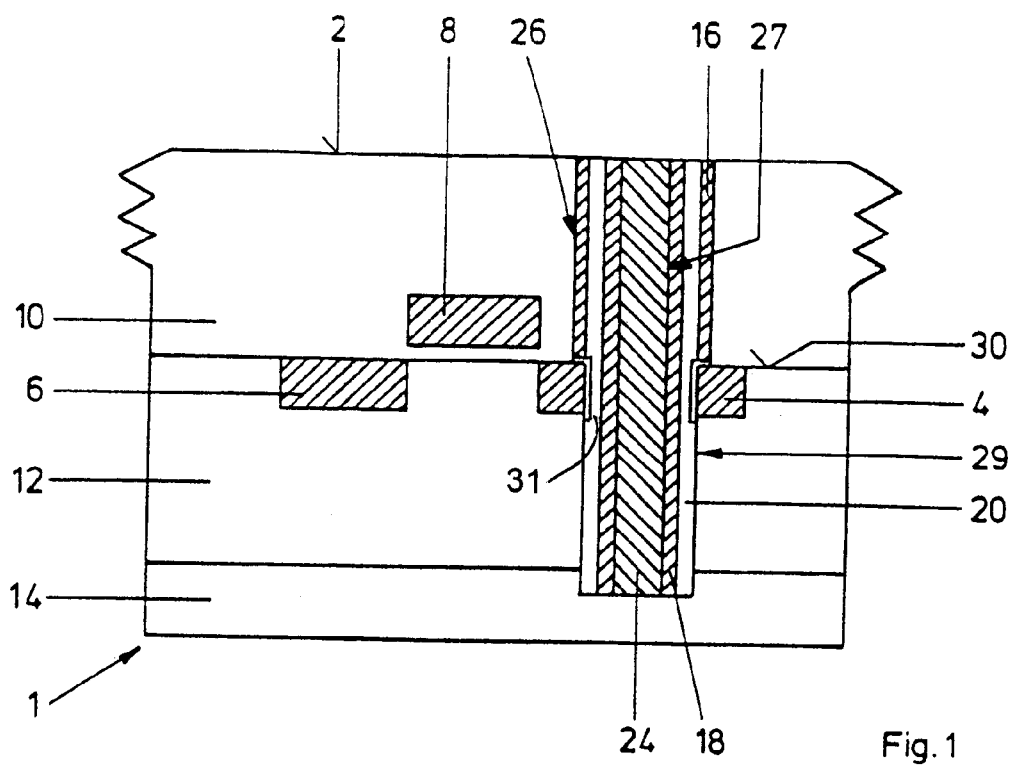
FIG. 1 is a partial cross-sectional view of a first exemplary embodiment of a semiconductor memory configuration according to the invention.

Unless indicated otherwise, identical reference symbols designate identical parts with the same meaning in the figures below. Referring now to the figures of the drawing in detail and first, particularly, to FIG. 1 thereof, there is shown a cross section through a section of a semiconductor memory configuration 1 according to the invention. The figure illustrates a memory cell of the semiconductor memory configuration 1. The memory cell has a selection transistor having a source region 4 and a drain region 6, which are provided in a semiconductor body 12. An insulation layer 10 is situated over the semiconductor body 12 and a gate 8 of the selection transistor is provided in the insulation layer, a thin region of the insulation layer 10 being provided between the gate 8 and the semiconductor body 12. The source and drain regions 4, 6 may be formed, for example, of regions of the semiconductor body 12 which are doped in a complementary manner with respect to the conductivity type of the semiconductor body 12, while the gate may be made of polysilicon, for example. Silicon dioxide $SiO_2$ or silicon nitride $Si_3N_4$, for example, can be used as the material for the insulation layer 10.

As is evident from FIG. 1, a common plate 14 is situated below the source and drain regions 4, 6 in the semiconductor body 12, wherein the common plate 14 can be a doped region of the semiconductor body 12. The insulation layer 10 has a cutout 26 over the source region 4, a first electrode 16 being applied on the side surface of the cutout. The cutout 26 in the insulation layer 10 reaches down to the source region 4, with the result that the first electrode 16 is electrically conductively connected to the source region 4. A second cutout 29 extends from a second main surface 30 of the semiconductor body downward through the source region 4 and the semiconductor body 12 right into the common plate 14. A storage dielectric 20 is applied over the first electrode 16 and on side surfaces of the second cutout 29, a second electrode 18 being situated, in turn, over the storage dielectric. The first electrode 16, the storage dielectric 20 and the second electrode 18 form a storage capacitor in the region of the cutout 26 in the insulation layer 10, while the storage dielectric 20 insulates the second electrode 18 from the source region 4 and the semiconductor body 12 in the region of the second cutout 29. A barrier layer 31 may be provided between the first electrode 16 and the source region 4 and also between the storage dielectric 20 and the source region 4. The barrier layer 31 protects the source region 4 against oxidation during the application of the storage dielectric 20 in a fabricating process of a semiconductor memory configuration of this type. The barrier layer is practical particularly when ferroelectric materials are used as the storage dielectric 20. The barrier layer may be formed, for example, of TiN, WN, WTiN or TaN. The second electrode 18 is electrically conductively connected to the common plate 14, and an interspace 27, which is provided within the second electrode 18, is filled with a conductive material which forms a conductive connection 24 and improves the charge carrier transport from the common plate 14 to the second electrode 18. The conductive connection 24 may be composed of polysilicon, for example, and a material for fabricating the two electrodes 16, 18 is, for example, platinum.

As is evident from FIG. 1, regions of a first main surface 2 of the insulation layer 10 are uncovered and exposed on the top. As a result, these regions can be used, in particular, for the interconnection of the semiconductor memory configuration 1. The illustration of word and bit lines, which are an example of an interconnection within semiconductor memory configurations, and also the illustration of further interconnections have been dispensed with in the example illustrated.

Figure 2:
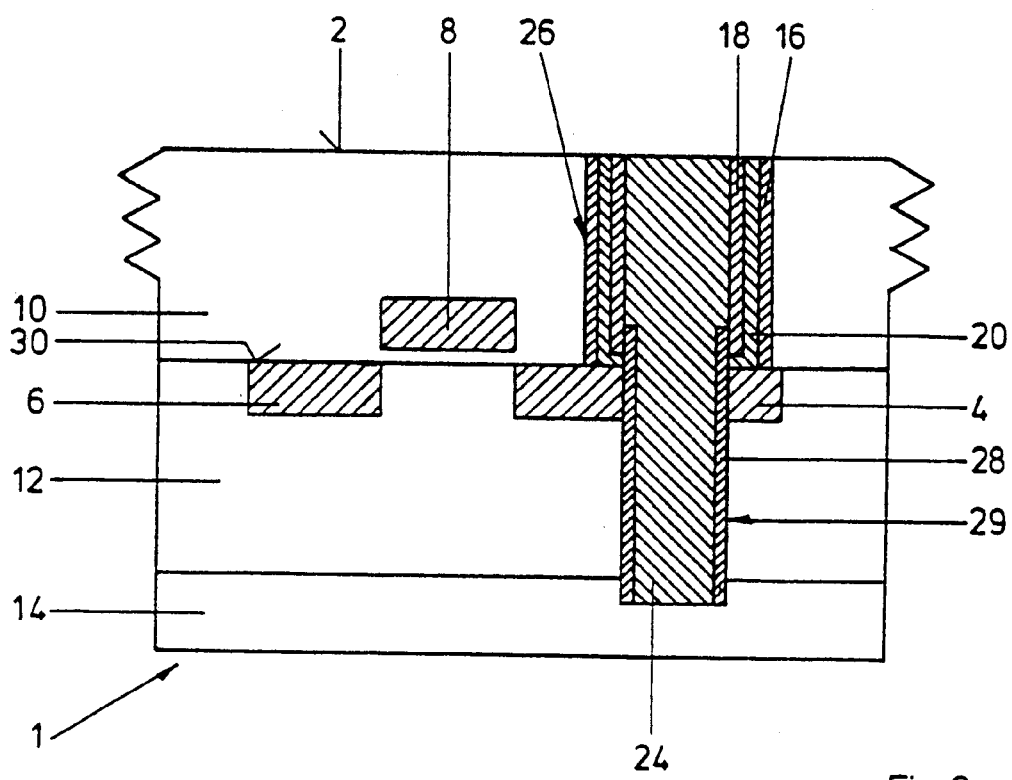
FIG. 2 is a partial cross-sectional view of a second exemplary embodiment of a semiconductor memory configuration according to the invention.

FIG. 2 is a cross-sectional view of a detail from a further exemplary embodiment of a semiconductor memory configuration 1. A memory cell illustrated in FIG. 2 has a storage capacitor provided on side surfaces of a cutout 26 in an insulation layer 10 over a source region 4 of a selection transistor. A first electrode 16 of the storage capacitor is electrically conductively connected to the source region 4. A storage dielectric 20 is applied over the first electrode 16, a second electrode 18 being applied over the storage dielectric, the storage dielectric 20 insulating the first electrode 16 and the second electrode 18 as well as the second electrode 18 and the source region 4 from one another. A barrier layer may be provided between the first electrode 16 and the source region 4 and also between the storage dielectric 20 and the source region 4, the barrier layer protecting the source region 4 against oxidation in the course of applying the storage dielectric 20 during the fabricating process of a semiconductor memory configuration of this type. The barrier layer is advantageous particularly when ferroelectric materials are used as the storage dielectric 20. The barrier layer may be composed, for example, of TiN, WN, WTiN or TaN. In the example illustrated, a second cutout 29 extends from a second main surface 30 of a semiconductor body 12 through the source region 4 and the semiconductor body 12 downward right into a common plate 14. An insulation collar 28 is applied on side surfaces of the second cutout 29. The insulation collar extends upward right into a cutout formed by the second electrode 18 and covers regions of the second electrode 18. An interspace formed within the second electrode 18 and the insulation collar 28 is filled by a conductive material, thereby producing a conductive connection 24. The conductive connection 24 is insulated from the source region 4 and the semiconductor body 12 by the insulation collar 28. The second electrode 18 is connected to the common plate 14 through the use of the conductive connection 24.

Figure 3:
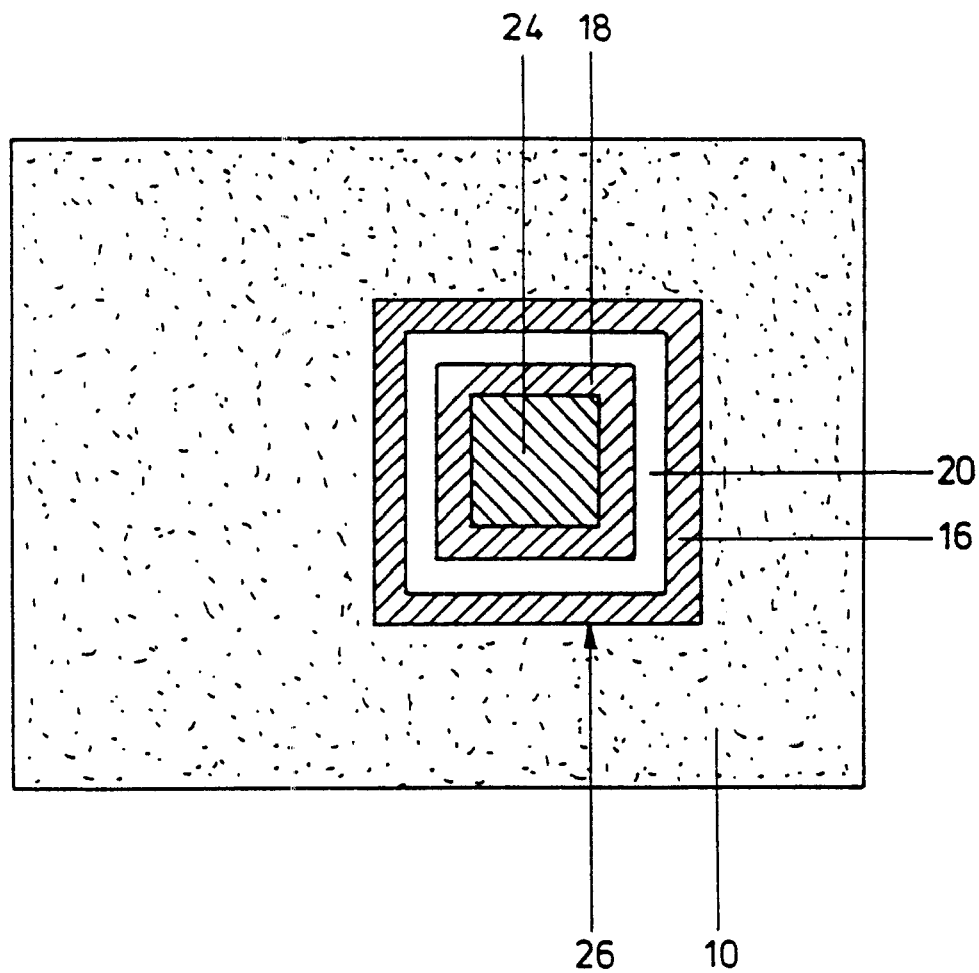
FIG. 3 is a plan view of a semiconductor memory configuration according to the invention.

The semiconductor memory configuration 1 illustrated in FIG. 1 or FIG. 2 is shown in a plan view in FIG. 3. The insulation layer 10, which contains the cutout 26, is shown. In this example, the cutout 26 is rectangular and the first electrode 16 is applied on the side surfaces of the cutout. The dielectric layer 20 is provided on the first electrode 16 and the second electrode 18 is provided on the dielectric layer. The interspace formed within the second electrode 18 is filled by the conductive connection 24.

We claim:

1. An integrated semiconductor memory configuration, comprising:

a) a semiconductor body having a first side and a second side;

b) an insulation layer formed on said first side of said semiconductor body, said insulation layer having a cutout formed therein, said cutout having a side surface;

c) a common plate formed on said second side of said semiconductor body and being a doped region; and d) a memory cell including
a selection transistor having a drain region and a source region formed in said semiconductor body, and a gate formed in said insulation layer;
a storage capacitor provided within said cutout, said storage capacitor having a first electrode disposed above said source region and in contact with said side surface of said cutout, said first electrode extending through said insulating layer and conductively connected to said source region, said storage capacitor having a second electrode extending through said insulating layer and surrounded by said first electrode;
a storage dielectric disposed between said first electrode and said second electrode;
conductive connection element extending downward through said source region and said semiconductor body and connecting said second electrode to said common plate; and
an insulation collar extending downward through said source region and said semiconductor body to said common plate and enclosing said conductive connection element in a region of said source region and in a region of said semiconductor body.

2. The semiconductor memory configuration according to claim 1, wherein said storage dielectric has ferroelectric properties.

3. The semiconductor memory configuration according to claim 1, wherein said storage dielectric has a dielectric constant of greater than 10.

4. The semiconductor memory configuration according to claim 1, wherein said storage dielectric is an oxidic dielectric.

5. The semiconductor memory configuration according to claim 4, wherein said oxidic dielectric is selected from the group consisting of $SrBi_2(Ta_{1-x}Nb_x)_2O_9$, $SrBi_2Ta_2O_9$, $(Pb, Zr)TiO_3$, $(Ba, Sr)TiO_3$, and $SrTiO_3$.

6. The semiconductor memory configuration according to claim 1, wherein said cutout is formed centrally over said source region.

7. The semiconductor memory configuration according to claim 1, wherein said common plate and said semiconductor body form an integral semiconductor substrate.

* * * * *